United States Patent [19]
Tetrev

[11] 3,995,146
[45] Nov. 30, 1976

[54] DETECTION SYSTEM FOR SPATIALLY-DISTRIBUTED SET OF RADIATION BEAMS MANIFESTING MULTIBIT BINARY CODE

[75] Inventor: Ronald Elmer Tetrev, Nabnasset, Mass.

[73] Assignee: RCA Corporation, New York, N.Y.

[22] Filed: Aug. 11, 1975

[21] Appl. No.: 603,438

[52] U.S. Cl. .................. 235/61.11 E; 340/146.3 P; 340/173 LM; 350/3.5
[51] Int. Cl.² .................... G06K 7/10; G11C 11/44; G02B 5/32; G06K 9/06
[58] Field of Search ............ 350/3.5; 250/568, 569; 340/146.3 F, 146.3 P, 173 MA, 174.1 M, 173 LM; 235/61.11 E, 61.7 B, 61.12 N

[56] References Cited
UNITED STATES PATENTS

| | | | |
|---|---|---|---|
| 3,636,317 | 1/1972 | Torrey | 235/61.12 N |
| 3,764,979 | 10/1973 | Gabor | 340/146.3 P |
| 3,806,706 | 4/1974 | Hasslinger | 235/61.11 E |
| 3,814,904 | 6/1974 | Russell | 235/61.11 E |
| 3,906,465 | 9/1975 | Moriwaki | 340/173 LM |
| R28,198 | 10/1974 | Dobras | 235/61.11 E |

Primary Examiner—Daryl W. Cook
Assistant Examiner—Robert M. Kilgore
Attorney, Agent, or Firm—George J. Seligsohn; Edward J. Norton

[57] ABSTRACT

Sampling of each bit position at its center is assured, despite random variations from one code to another in both spatial displacement of the radiation beams with respect to the contiguous sensing elements of an array and the width of the radiation beams, with only the center-to-center spacing between adjacent bit positions remaining predetermined and invariant. This is accomplished by (1) employing a sync bit as the first bit of the code, (2) loading each sensing element into a corresponding stage of a shift register, (3) shifting out the shift register at a predetermined clock rate, (4) applying no counting input to a counter until the detection of a read out sync bit from the shift register and then applying a counting input to the counter at one-half the clock rate while the sync bit is being read out and thereafter at the clock rate itself. Counts registered in the counter control a sampling gate for passing each successive bit of the code read out from the shift register at its center particularly suitable for codes obtained from reconstructed embossed plastic Fraunhofer holograms that have been dynamically pressed.

2 Claims, 6 Drawing Figures

DETECTION SYSTEM FOR SPATIALLY-DISTRIBUTED SET OF RADIATION BEAMS MANIFESTING MULTIBIT BINARY CODE

The invention herein disclosed was made in the course of or under a contract or subcontract thereunder with the Department of the Navy.

This invention relates to a system for detecting spatially-distributed beam of radiation manifesting a binary code and, more particularly, such a detecting system which is dependent only upon the center-to-center spacing between adjacent beams and is independent of both the absolute spatial position of the beams and the cross-sectional width of each of the beams.

The use of embossed plastic as a recording medium having a high information packing density for holographically-encoded pictorial or digital data is known in the art. In one such system, which has been developed, a set of focused-image holograms of aerial maps are embossed on a plastic recording medium. Any one of these maps may be selectively reconstructed from the hologram by appropriate addressable means and be used by the pilot of an aircraft for navigational purposes. In order to facilitate the selective readout of any of a group of focused-image holograms, each focused-image hologram is identified by a corresponding small Fraunhofer hologram of a serial binary code, which Fraunhofer hologram is also embossed in the plastic recording medium. An automatic selection system forming part of the addressable means is capable of selecting a desired map for readout by comparing the address of the binary code reconstructed from each Fraunhofer hologram with a command address inserted by the pilot which identifies the desired map.

Embossing of the plastic hologram recording medium is often accomplished by dynamic pressing, which can result in slight random spatial frequency variations in the embossed fringes of the Fraunhofer hologram. By preferential orientation of the fringes with the rolling direction of the dynamic pressings and by extremely close tolerance control of the pertinent pressing parameters, the maximum variation in spatial frequency of the fringes may be made suitably small to provide adequate readout system performance. However, the relatively high cost of maintaining close tolerance control as well as limitations in readout system performance required to accommodate the relatively small spatial frequency variations which still exist even with close tolerance control constitute disadvantages which are eliminated by the present invention.

The techniques taught by the present invention make it unnecesary to provide extremely close tolerance control of the pertinent pressing parameters, thereby reducing cost, and at the same time significantly improve the readout system performance. In particular, the solution to this problem provided by the present invention has the advantages of (1) allowing for a compression of the data over that provided by the prior art readout system, (2) relieving the constraints on the dynamic pressing system, and (3) reducing the constraints on the playback optics, thereby providing a more reliable system.

Briefly, the present system is similar to the prior array of contiguous photodiodes to sense a reconstructed serial binary code and also employs a shift register having a stage corresponding to each of the photodiodes for storing the information sensed by the photodiodes of the array. In both the prior art readout system and the readout system of the present invention, the information stored in the shift register is shifted out at some clock rate for further use. However, in accordance with the principles of the present invention, an additional sync bit occupies the first bit position of the serial binary code, which is read out from the shift register. Further, the system of the present invention includes a counter which receives no counting input prior to the detection of a sync bit being read out from the shift register. While a read out sync bit is being detected, the counter receives a counting input at one-half the rate at which the shift register is being read out. Then, after the end of the detection of the read out sync bit, the counter receives a counting input at the same rate as the shift register is being read out. The count registered by the counter is useful as a measure of the time of occurrence of the respective centers of each successive serial bit of the binary code which follows the sync bit. An output from the counter may be used to open a normally-closed gate which samples each successive serial bit following the sync bit read out from the shift register at its center and forwards each sample to appropriate utilization means.

These and other features and advantages of the present invention will become more apparent from the following detailed description taken together with the accompanying drawing in which.

Figure 1:
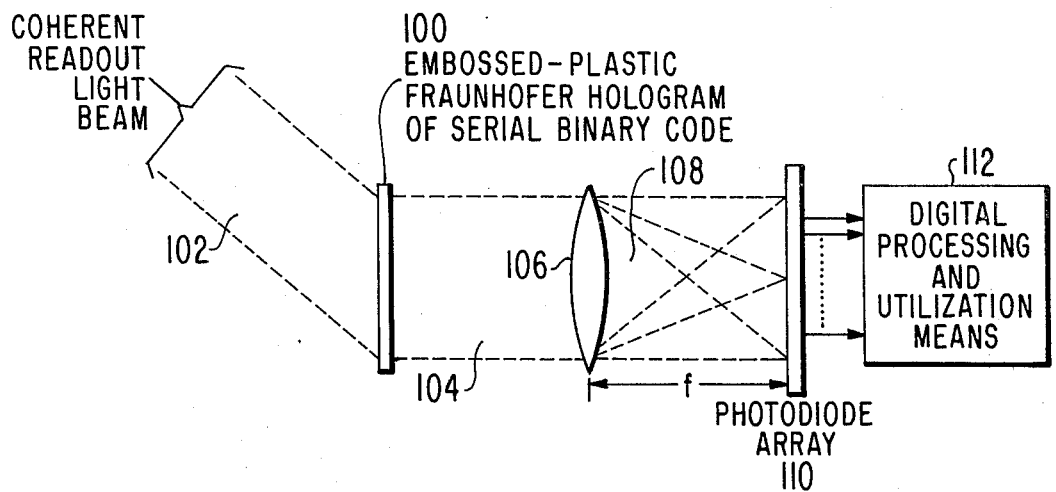
FIG. 1 is a schematic illustration of an arrangement for reading out an embossed Fraunhofer hologram.
Figure 2:
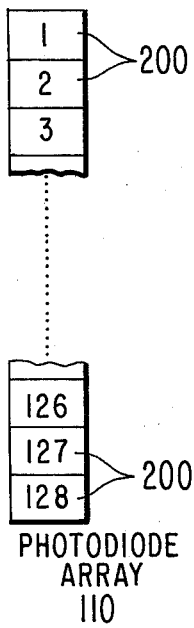
FIG. 2 is a somewhat more detailed showing of the photodiode array of FIG. 1.

Referring to FIG. 1, an embossed-plastic Fraunhofer hologram of a serial binary code 100 may be read out, in a manner known in the art, illuminating illuminatin hologram 100 with a plane-wave coherent readout light beam 102. This results in a plane-wave first diffraction order information beam 104 being derived. Information beam 104 illuminates image lens 106, having a focal length f. In response to the illumination thereof by information beam 104, image lens 106 reconstructs an image of the serial binary code manifested by Fraunhofer hologram 100 in the back focal plane of lens 106. More specifically, image lens 106 transforms plane-wave information beam 106 into focused information light 108, which is imaged into a group of spatially-distributed beams of light, in accordance with the aforesaid serial binary code, which spatially-distributed beams are incident on photodiode array 110 situated substantially in the back focal plane of lens 108. Photodiode array 110 may comprise a linear array of a given number $n$, such as 128, contiguous photodiodes, as shown in FIG. 2.

The respective photodiodes of photodiode array 110 sense the presence or absence of incident light thereon. As shown in FIG. 1, an output signal corresponding to the state of the light sensed by each respective photodiode of array 110 is coupled as an input to digital processing and utilization means 112.

Figure 3:
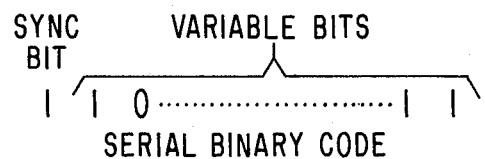
FIG. 3 is a typical example of a serial binary code employed by the present invention.

As shown in FIG. 3, the serial binary code of the type employed in the present invention includes a plurality of $m$, such as 10, bits. Further, as shown in FIG. 3, the bit occupying the first binary position of the serial binary code is a sync bit, which always has a predetermined binary value, such as binary ONE. The bits occupying the remaining bit positions of the serial binary code are variable bits which may have respectively a binary value of either binary ONE or binary ZERO in accordance with the particular value manifested by that serial binary code. For illustrative purposes, it is assumed that the respective binary values of the variable bits have the specific values 1, 0 . . . 1, 1 shown in FIG. 3.

Figure 4:
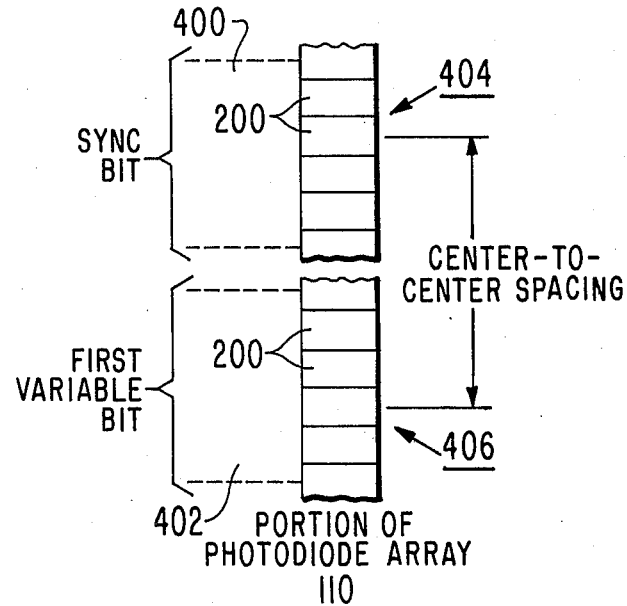
FIG. 4 is a diagram showing the relationship between the first two binary-coded-bit manifesting radiation beams and the photodiode elements of the array on which they are incident.

Referring now to FIG. 4, each bit of the serial binary code manifesting a predetermined binary value, such as binary ONE, is manifested by a respective one of the group of spatially distributed beams of light radiation, such as light radiation beam 400 manifesting the sync bit shown in FIG. 3, and light radiation beam 402 manifesting the first variable bit shown in FIG. 3. As further shown in FIG. 4, light radiation beam 400, which is incident on a first portion 404 of photodiode array 110 has a cross-sectional width many times the extent of a single contiguous photodiode element 200. In a similar manner, the cross-sectional width of light radiation beam 402, which is incident on a second portion 406 of photodiode array 110, is also many times greater than the extent of a single contiguous photodiode element 200. In practice, the actual cross-sectional width of the light radiation beams, such as beams 400 and 402 may vary quite widely from one Fraunhofer hologram to another. By way of example, each light radiation beam, such as beams 400 and 402, may illuminate as few as three to four contiguous photodiode elements 200 or may illuminate as many as 506 contiguous photodiode elements 200. Furthermore, the relative spatial position of a light radiation beam, such as light radiation beams 400 and 402, with respect to photodiode array 110 may vary from one Fraunhofer hologram to another. Thus, first portion 404 of photodiode array 110 illuminated by sync bit light radiation beam 400 may, by way of example, illuminate photodiode elements 200 having ordinal positions 10 to 13 of photodiode array 110 in one case, while, in another case, light radiation beam 400 may illuminate photodiode elements 200 having the ordinal positions 19 to 24. However, the one parameter which remains predetermined and substantially invariant from one Fraunhofer hologram to another is the center-to-center spacing, shown in FIG. 4, between each respective adjacent pair of bit positions of the binary code. This center-to-center spacing, which is predetermined during the recording of the Fraunhofer hologram of the serial binary code, if desired, may have different predetermined values between one particular respective adjacent pair of bit positions, such as between the first and second bit positions, and another particular respective adjacent pair of bit positions, such as between the second and third bit positions. However, once predetermined, the center-to-center spacing between any particular respective adjacent pair of bit positions will always be substantially the same from one Fraunhofer hologram to another.

Figure 5:
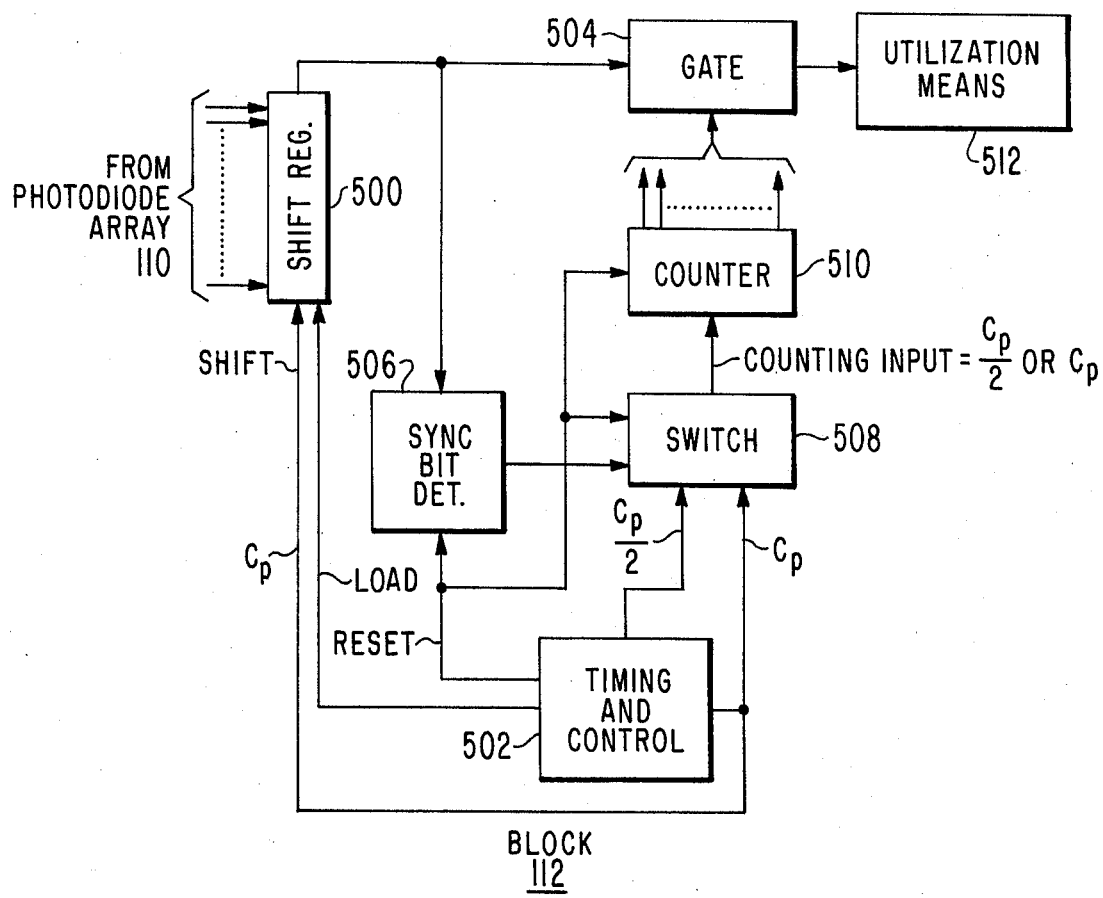
FIG. 5 illustrates an embodiment of the present invention which is incorporated in the digital processing and utilization means of FIG. 1.

The embodiment of digital processing and utilization means 112 shown in FIG. 5 takes advantage of this predetermined and invariant center-to-center spacing between each particular respective adjacent bit positions, as shown in FIG. 4, to provide reliable detection of the serial binary code, despite random variations from one Fraunhofer hologram to another in both the cross-sectional widths of the light radiation beams incident on photodiode array 110 and the relative positions of these light radiation beams with respect to photodiode array 110, as discussed above.

Referring now to FIG. 5, the respective outputs from each of the contiguous photodiode elements of photodiode array 110 are applied to corresponding stages of shift register 500, which stores the information (upon receipt of load command) sensed by photodiode array 110. Shift register 500 is read out in response to shift pulses applied thereto from timing and control means 502 at a clock rate of $C_p$. The direction of readout of shift register 500 is such that the bit position occupied by the sync bit of the serial binary code is the first read out bit position from shift register 500. The read out output from shift register 500 is applied both as a signal input to normally-closed gate 504 and as a signal input to sync bit detector 506. Initially, sync bit detector 506, switch 508 and counter 510 are in a reset state produced in response to a reset signal applied thereto from timing and control 502. Sync bit detector 506 may be a logic circuit including suitable gate elements and flip-flop elements for deriving an output signal only during the presence of (or, alternatively, at the leading and lagging edges of) the first-occurring output pulse from shift register 500 manifesting a binary ONE, i.e., only during the presence of (or, alternatively, the leading and lagging edges of) the sync bit.

The output from sync bit detector 506 is applied as a control input through switch 508. Switch 508, which, in effect, is a signal-controlled three-position switch, is initially placed in its home position in response to the reset signal applied thereto. Switch 508 is switched from its home position to a first switch position thereof in response to the beginning of a sync bit detected by sync bit detector 506 and is switched from its first switch position to a second switch position thereof in response to the end of the sync bit detected by sync bit detector 506.

In its home position, switch 508 forwards no output signal to the counting input of counter 510. However, in its first switch position, switch 508 forwards to the counting input of counter 510 a series of pulses which occur isochronously with every other shift pulse applied to shift register 500, i.e., at a rate $C_p/2$ equal to half the clock rate $C_p$ of the shift pulses. In its second switch position, switch 508 forwards the shift pulses themselves, which occur at the clock rate $C_p$, to the counting input of counter 510.

Figure 6:
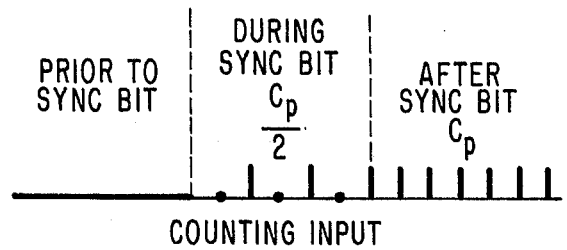
FIG. 6 is a timing diagram of the counting input of FIG. 5.

FIG. 6 is a timing diagram of a typical counting input to counter 510. In FIG. 6, it is assumed for illustrative purposes that the width of light radiation beam 400, manifesting the sync bit, is such as to be incident on a first portion 404 of photodiode array 110 consisting of six contiguous photodiode elements. Therefore, the sync bit read out of shift register 500 will have a duration of 6 clock periods. As shown in FIG. 6, prior to the occurrence of the read out sync bit, no counting pulses occur on the counting input of counter 510. During the occurrence of the read out sync bit, which is assumed to have a duration of 6 clock periods, a total of only 3 counting pulses occur, because the counting input is then $C_p12$. After the occurrence of the sync bit, however, the counting input occurs every clock period.

Counter 510 is arranged to derive an output signal whenever the count registered therein corresponds with each successive center-to-center spacing between each particular respective adjacent bit positions of the binary code, which, as discussed above, are predetermined and are invariant from one Fraunhofer hologram to another.

Since no counting by counter 510 takes place prior to the occurrence of a sync bit, and during the occurrence of the sync bit takes place at only one-half the rate at which shift pulses are applied to shift register 500, the count registered in counter 510 at the end of the sync bit corresponds to a count equal to (or differing by no more than one from) the count which would be registered in counter 510 if counting by counter 510 started only at the center of the sync bit and then occurred at the clock rate itself rather than at half the clock rate. Therefore, normally-closed gate 504 is opened at the center of each successive variable bit of the serial binary code and thereby forwards a sample of each of these successive variable bits at the output of shift register 500 to utilization means 512.

It will be apparent that the present invention is useful in any case where one or more linear arrays of $n$ substantially contiguous sensing elements is used to detect the presence or absence of a group of spatially-distributed beams of given radiation in which each beam manifests an individual bit of an $m$-bit binary code having a predetermined binary value, regardless of whether the given radiation is light, or other electromagnetic or acoustic wave energy, or a beam of particles.

What is claimed is:

1. In a system comprising first means including a linear array of n substantially contiguous sensing elements for detecting the presence or absence of each of a group of spatially-distributed beams of given radiation in which each beam manifests an individual bit of an m-bit binary code which has a predetermined binary value, said m-bit binary code being of the type in which the bit situated in a given one of the end bit positions is a synch bit having said predetermined binary value, wherein each of said beams is incident on a plural-member subset of said contiguous elements, and wherein the respective number of contiguous elements corresponding to the center-to-center spacing of each respective adjacent pair of bit positions of said binary code is predetermined; the improvement therewith comprising:

a. a shift register having a respective ordinal stage corresponding to each ordinal one of said contiguous elements of said array, said shift register being coupled to said array for storing the detected signal outputs from said respective elements of said array;
 b. means for applying shift pulses to said shift register at a predetermined clock rate to read out said shift register in a direction such that the first bit position read out is said sync bit;
 c. a normally closed gate coupled to said shift register for forwarding the readout from said shift register to utilization means only in response to the opening thereof;
 d. an initially reset counter coupled to said gate for opening said gate in response to each of a set of predetermined counts having been counted in order by said counter, each of said set of predetermined counts corresponding to the center-to-center spacing of each successive adjacent pair of bit positions; and
 e. second means including a sync bit detector coupled between said shift register and said counter which (1) is operative prior to a sync bit read out from said shift register being detected by said sync bit detector for applying no counting input to said counter, (2) is operative while the detection of said read out sync bit by said sync bit detector is occurring for applying a counting input to said counter at half said clock rate, and (3) is operative subsequent to the end of detection of said read out sync bit by said sync bit detector for applying a counting input to said counter at said clock rate.

2. The system defined in claim 1, wherein said first means further includes an embossed medium incorporating a Fraunhofer hologram of said m-bit binary code, means for illuminating said hologram with a readout beam of coherent light radiation to obtain a plane-wave information beam of coherent light radiation, an image lens having a given focal length in the path of said coherent light radiation to derive said group of spatially-distributed beams and effect the reconstruction of said m-binary code in the back focal plane of said image lens, said linear array being situated substantially in the back focal plane of said image lens and is an array of photodiode sensing elements.

* * * * *